United States Patent
Iriguchi

(10) Patent No.: US 7,352,442 B2
(45) Date of Patent: Apr. 1, 2008

(54) ALIGNER, EXPOSING METHOD, METHOD FOR MANUFACTURING THIN-FILM TRANSISTOR, DISPLAY DEVICE, AND ELECTRONIC DEVICE USING SHADING MEANS

(75) Inventor: Chiharu Iriguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 553 days.

(21) Appl. No.: 10/790,221

(22) Filed: Mar. 2, 2004

(65) Prior Publication Data

US 2004/0185353 A1    Sep. 23, 2004

(30) Foreign Application Priority Data

Mar. 17, 2003    (JP)    ............... 2003-072092

(51) Int. Cl.
  *G03B 27/54*    (2006.01)
  *G03B 27/72*    (2006.01)
(52) U.S. Cl. .......................... 355/71; 355/67
(58) Field of Classification Search ................ 355/53, 355/67, 71, 77; 250/548
  See application file for complete search history.

(56) References Cited

U.S. PATENT DOCUMENTS

| | | | | |
|---|---|---|---|---|
| 4,734,746 A | * | 3/1988 | Ushida et al. ................ | 355/53 |
| 5,194,893 A | * | 3/1993 | Nishi ........................... | 355/53 |
| 6,078,381 A | * | 6/2000 | Suzuki ......................... | 355/53 |
| 6,462,807 B1 | * | 10/2002 | Nishi ........................... | 355/53 |
| 6,608,665 B1 | | 8/2003 | Nishi et al. | |

FOREIGN PATENT DOCUMENTS

| | | |
|---|---|---|
| CN | 2395299 | 9/2000 |
| CN | 2525562 | 12/2002 |
| JP | A 11-233423 | 8/1999 |
| JP | A 2003-297736 | 10/2003 |
| KR | 1995-0001857 | 1/1995 |

* cited by examiner

*Primary Examiner*—Rodney Fuller
(74) *Attorney, Agent, or Firm*—Oliff & Berridge, PLC

(57) ABSTRACT

An aligner to expose any exposure area includes an exposure light source that emits an exposure beam having a specified width to expose the exposure area to light; a douser having a width corresponding to at least the width of the exposure beam; and a shading unit to prevent the exposure beam from reaching an area other than the exposure area by driving the douser to shut off part or all of the exposure beam. The aligner is capable of forming different exposure areas with high density and having a structure suitable to reduce the size of the entire unit.

14 Claims, 9 Drawing Sheets

ALIGNER, EXPOSING METHOD, METHOD FOR MANUFACTURING THIN-FILM TRANSISTOR, DISPLAY DEVICE, AND ELECTRONIC DEVICE USING SHADING MEANS

BACKGROUND OF THE INVENTION

1. Field of Invention

The present invention relates to a holographic aligner for exposure with a hologram and, more particularly, to an aligner and an exposing method suitable to expose part of a hologram mask.

2. Description of Related Art

In a semiconductor-device patterning process, a related art total-internal-reflection (TIR) holographic exposing technique has come to attract attention. The exposing technique includes a recording process of recording a desired pattern in a hologram and an exposing process of irradiating the hologram mask with regenerated light to expose a photoresist for a semiconductor pattern to light.

In the recording process, a laser recording beam is applied to a mask pattern (original reticle), corresponding to the pattern of a semiconductor device, to generate diffracted light and irradiate the recording surface of a hologram mask. Reference light is applied to the recording surface of the hologram mask from the back at a fixed angle to interfere with the diffracted light from the original reticle, thereby generating an interference pattern on the recording surface of the hologram mask and recording the interference pattern on the hologram recording surface.

In the exposing process, the hologram mask is placed at the same position as that of the original reticle to irradiate it with an exposure beam, or regenerated light, from the opposite direction of that used in the recording process to image the diffracted light that reproduces an original pattern on a photoresist, to thereby expose the photoresist to light.

The exposure beam used in the exposing process is generally adapted to scan the entire surface of the hologram mask. In order to expose only part of the hologram mask, a douser as large as the hologram mask is generally used.

Alternatively, only part of the hologram mask maybe exposed by controlling the scanning area of the exposure beam.

SUMMARY OF THE INVENTION

However, in order to form a plurality of exposure areas on the same hologram mask, it was necessary to provide a buffer area around the respective exposure areas A to E to ensure even exposure, as shown in FIG. 8(A).

Also in order to make it possible to shield an exposure area of any shape from light, it is necessary to use a large douser, resulting in increased size of the aligner greatly. The periphery of the exposure areas must be covered to completely shield the exposure area, in any given position on the hologram mask, from light. Each douser must be at least as large as the hologram mask in order to correspond to the case in which the exposure area is one-sided on the hologram mask. It is also necessary to use at least four dousers, each having an area corresponding to that of the hologram mask, in order to surround the exposure area in any position. Particularly, when the exposure area is relatively large with respect to the hologram mask, the area where the douser extends turns out to be three times the width of the hologram mask. The problem comes to the fore as the size of the hologram mask increases.

Accordingly, the present invention provides an aligner and an exposing method capable of forming different exposure areas with high density and having a structure to reduce the size of the entire device.

In order to achieve the above object, the present invention provides an aligner to expose any exposure area to light, including: a light-emitting device that emits an exposure beam having a specified width to expose the exposure area to light; a douser having a width corresponding to at least the width of the exposure beam; and a drive unit to prevent the exposure beam from reaching an area other than the exposure area by driving the douser to shut off part or all of the exposure beam.

Specifically, when the exposure area has a shape surrounded by sides, such as a rectangle, the douser at least as many dousers as the number of the sides of the exposure area may be provided, each corresponding to the side and having a width and a height corresponding to at least the width of the exposure beam.

Here, there is no limitation to the object of exposure and the aligner can be applied to general photolithographic exposure.

Further, the aligner may include a plurality of dousers substantially perpendicular to the direction of emission of the exposure beam and driven separately along either of two intersecting directions; and a drive unit to drive the dousers.

Further, the aligner may include four dousers substantially perpendicular to the direction of emission of the exposure beam and driven separately along either of two intersecting directions; and a drive unit to drive the dousers.

Further, the aligner may include a douser capable of moving substantially perpendicular to the direction of emission of the exposure beam and a drive unit to drive the douser.

In addition, the light-emitting device shifts the center of the exposure beam within an area not exceeding a width corresponding to one-half of the width of the exposure beam in the shade from the boundary of the exposure area in the shade plane.

In addition, the drive unit of the aligner moves the douser so that the exposure beam reaches only the exposure area when the distance between the center of the exposure beam and the boundary of the exposure area is equal to or less than one-half of the width of the exposure beam.

Further, an aspect of the invention provides an exposing method to expose any exposure area, including: in order to shut off part of an exposure beam having a specified width and prevent the exposure beam from reaching an area other than an exposure area, a scan control process of moving the center of the exposure beam within a scanning area not exceeding a width corresponding to approximately one-half of the width of the exposure beam in a shade plane from a boundary of the exposure area in the shade plane; and a shading control process of shutting off part or all of the exposure beam by moving a douser having a width and a height corresponding to at least the width of the beam to prevent the exposure beam from reaching an area other than the exposure area.

Specifically, the exposing method includes a scan control process of shifting the center of an exposure beam having a specified width within a scanning area not exceeding a width corresponding to approximately one-half of the width of the beam in the shade plane from the boundary of the exposure area in the shade plane corresponding to the exposure area and performing exposure, by shutting off part or all of the exposure beam having a specified width to prevent the exposure beam from reaching an area other than the exposure area, when the exposure area has a shape surrounded by sides, such as a rectangle.

Here the exposing process includes the: positioning the center of the exposure beam on the boundary of the scanning area; causing the exposure beam to scan in a first direction after the exposure beam has become stable; moving the exposure beam by a specified distance in a second direction when the center of the exposure beam has reached the other end of the scanning area to cause the exposure beam to scan in the opposite direction to the scanning direction before reaching the other end; and completing the exposure when the center of the exposure beam has reached the terminal of the scanning area.

In the exposing method of an aspect of the invention, the scan control process may further include a shading control step of moving the douser in synchronization with the scanning speed so that the exposure beam does not reach the area other than the scanning area when the center of the exposure beam during the scanning in the first direction is positioned within one-half of the width of the exposure beam from the scanning area toward the area other than the scanning area.

Further, an aspect of the present invention provides a method to manufacture a thin-film transistor, including: a scan control process of shifting the center of an exposure beam having a specified width, with respect to the exposure area on a photosensitive resin, within a scanning area not exceeding a width corresponding to one-half of the width of the exposure beam from the exposure area; a shading control process of shutting off part or all of the exposure beam by moving a douser having a width and a height corresponding to at least the width of the beam to prevent the exposure beam from reaching an area other than the exposure area; a mask-pattern forming process of forming a mask pattern by etching the photosensitive resin on which a specified pattern is formed through the scan control process and the shading control process; and an electrode forming process of forming a gate electrode using the mask pattern.

Further, an aspect of the present invention provides a display device including a thin-film transistor manufactured by the above-described method to manufacture a thin-film transistor.

Further, an aspect of the present invention provides an electronic device including the aforesaid display device.

DETAILED DESCRIPTION OF EXEMPLARY EMBODIMENTS

Exemplary embodiments of the present invention will be described with reference to the drawings.

First Exemplary Embodiment

A holographic aligner according to a first exemplary embodiment of the invention performs a main scan across a hologram mask with an exposure beam horizontally (or laterally) (in h-direction of FIGS. 1 and 5) and a subscan perpendicularly (or vertically) (in v-direction in FIGS. 1 and 5) to perform exposure.

Figure 3:
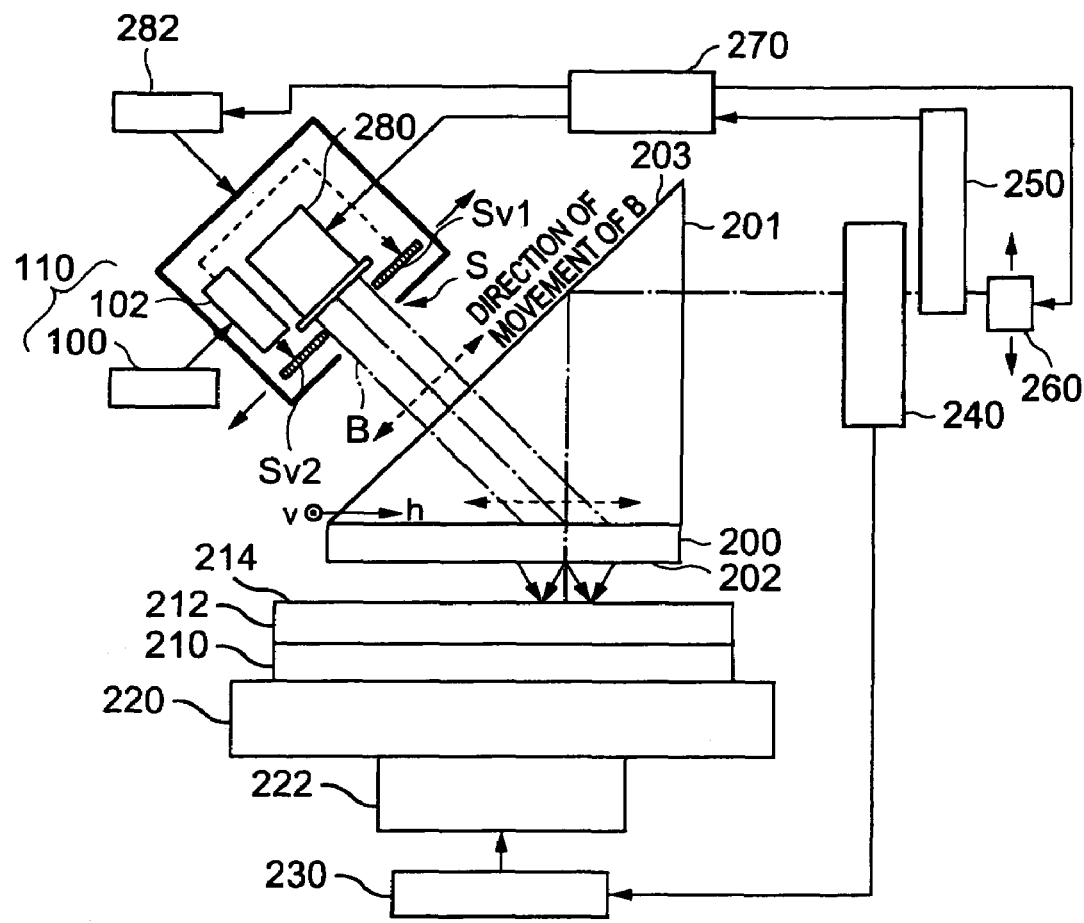
FIG. 3 is a block schematic of a holographic aligner according to a first exemplary embodiment.

Referring first to FIG. 3, the structure of the holographic aligner will be described. The drawing shows the entire structure of a total internal reflection (TIR) holographic aligner.

The aligner includes a prism 201, a stage unit 222 having a stage 220, a first information processor 230, a range-finding optical system 240, a film-thickness measuring optical system 250, a light source 260, a second information processor 270, an exposure light source 280, an exposure-light-source drive unit 282, and a shading unit 110 according to an aspect of the invention. On the surface of the prism 201 facing the mount surface of the stage 220 on which an exposure substrate 210 is disposed, a hologram mask 200 is provided in which an interference pattern, corresponding to a specified reticle pattern, is recorded.

The stage unit 222 is constructed to hold the exposure substrate 210 having a photosensitive film 212 on the stage 220 with a vacuum chuck or the like and allow at least the vertical (z-direction) positioning control of the stage 220.

The light source 260 is constructed to be able to emit measuring beams of the range-finding optical system 240 and the film-thickness measuring optical system 250. The range-finding optical system 240 includes a beam splitter, a cylindrical lens, a photosensor, and an error-signal detector and is constructed to be able to control the focus for exposure by adjusting the distance between a hologram recording surface 202 and a photosensitive film surface 214 applied on the exposure substrate 210 (the gap between the hologram recording surface 202 and the photosensitive film surface 214).

The first information processor 230 is constructed to set the position of the stage 220 to obtain correct focus on the basis of the distance between the hologram recording surface 202 and the photosensitive film surface 214 formed on the exposure substrate measured by the range-finding optical system 240. The film-thickness measuring optical system 250 includes a beam splitter, a photodetector, an amplifier and an A/D converter and has a structure to measure the thickness of the photosensitive film 212 formed on the exposure substrate 210.

The second information processor 270 corresponds to a drive unit of an aspect of the invention. It is constructed to move the exposure light source 280 so that an exposure beam B, emitted from the exposure light source 280, scans in a proper exposure area specified by the shading unit 110 and to control the light amount for exposure on the basis of the relative value of the thickness of the photosensitive film 212 outputted from the film-thickness measuring optical system 250.

The exposure light source 280 corresponds to an illuminator of an aspect of the invention, which is constructed to emit the exposure beam B onto the hologram recording surface 202 of the hologram mask 200. The exposure-light-source drive unit 282 corresponds to the drive unit of an aspect of the invention, which is constructed to move the exposure light source 280 in at least two directions along a slope 203 of the prism 201 to scan a desired exposure area on the exposure substrate 210, for example, horizontally or vertically (in v- or h-direction in FIG. 3). The direction of the movement of the exposure light source 280 is not limited to the horizontal and vertical directions but may be set in intersecting two directions as appropriate.

As described above, the aligner includes the prism 201 which has the hologram mask 200 mounted on the surface facing the exposure substrate 210, the hologram mask 200 recording an interference pattern corresponding to a specified reticle pattern.

The shading unit 110 corresponds to a douser of an aspect of the invention and includes shutter S including dousers Sv1, Sv2, Sh1, and Sh2 (refer to FIG. 1 for Sh1 and Sh2), a third information processor 100, and a shutter drive unit 102. The dousers constituting the shutter S are the light blocking elements, each having a strip shape, and being made of a metal or the like coated with a light blocking material (black carbon or chromium). The dousers can be moved vertically or nearly vertically with respect to the irradiation direction of the exposure beam, separately or in conjunction with one another. The third information processor 100 stores the positional information of the exposure area, and calculates the operating time and moving speed of the shutter S, or stores the control information on the shutter S in advance. The shutter drive unit 102 is a combination of a motor and mechanism components and is capable of moving the shutter S at many moving speeds and arranging them in any positions on the basis of a control signal from the third information processor 100 by a known mechanism technique.

Figure 1:
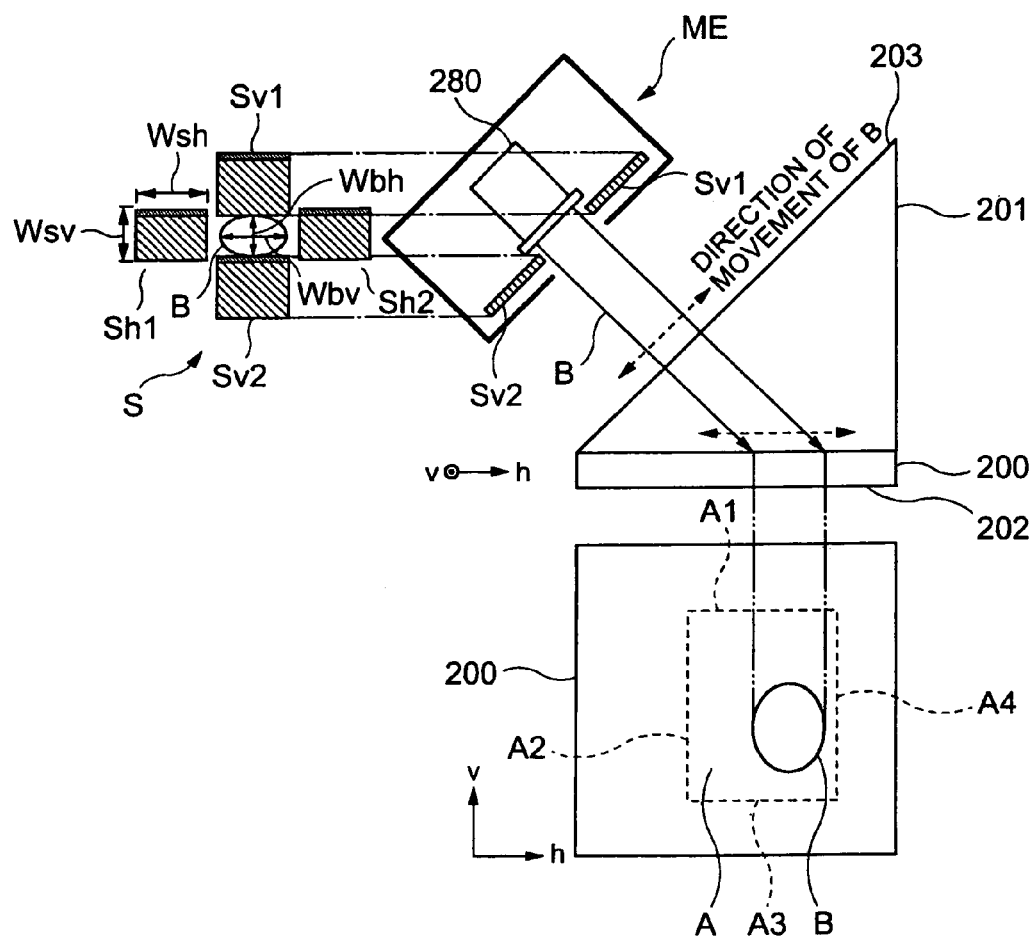
FIG. 1 is an explanatory schematic of the configuration principle of an aspect of the present invention.

FIGS. 1 and 2 are explanatory schematics to explain the principle of the exposing method of the invention. In the drawings, components corresponding to those of FIG. 3 are given the same numerals and their description will be omitted.

FIG. 1 shows the positional relationship among a moving exposure system ME including the exposure light source 280 and the shutter S, the prism 201, and the hologram mask 200.

Figure 2A:
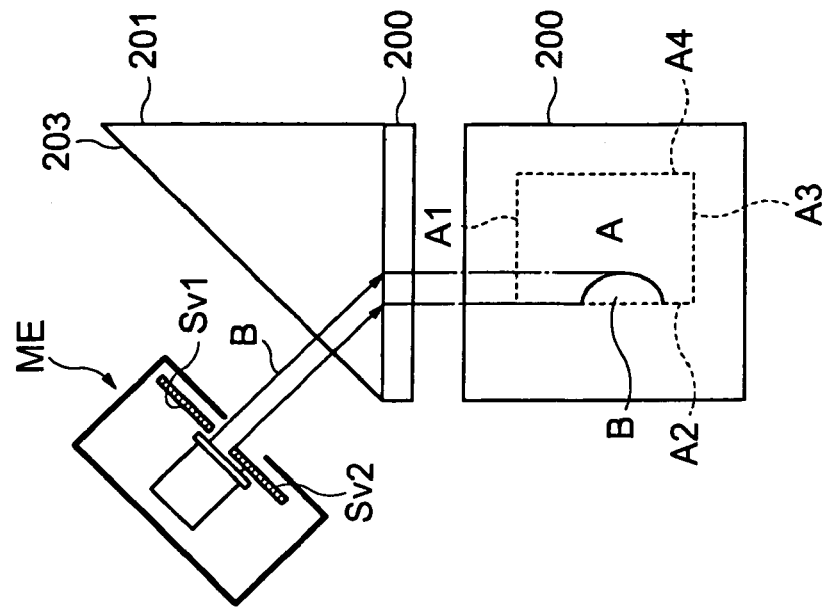
FIGS. 2(A) and 2(B) are explanatory schematics of the operation principle of an aspect of the invention.

In this exemplary embodiment, as shown in FIG. 1, since an exposure area A on the hologram mask 200 is rectangular, the four dousers Sv1, Sv2, Sh1, and Sh2 corresponding to the four sides thereof are used as the shutter S. As many shutters are provided as the number of the sides of exposure area A. The respective shutters are in correspondence with the light blocking of the respective sides of the exposure area A. The width of each shutter is at least longer than the width of the exposure beam B, corresponding to the arrangement direction of each shutter. The width Wsh and the height Wsv of each shutter S are at least the same as the width Wbh and the height Wbv of the exposure beam B emitted from the exposure light source 280. When the exposure beam B goes out of the side A4 of the exposure area A, as shown in FIG. 2(A), the shutter Sv1 moves to shut off the exposure beam B so as to prevent the outside of the side A4 of the exposure area A from being irradiated with the exposure beam B.

Figure 2B:
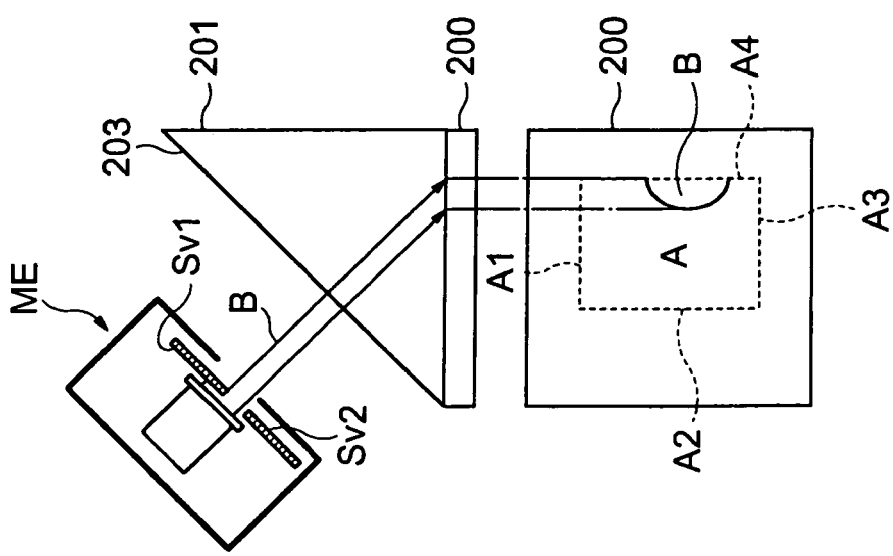

Referring to FIG. 2(B), when the exposure beam B goes out of the side A2 of the exposure area A, the shutter Sv2 moves to shut off the exposure beam B so as to prevent the outside of the side A2 of the exposure area A from being irradiated with the exposure beam B.

Similarly, when the exposure beam B goes out of the side A1 of the exposure area A, the shutter Sh1 moves to shut off the exposure beam B so as to prevent the outside of the side A1 of the exposure area A from being irradiated with the exposure beam B. When the exposure beam B goes out of the side A3 of the exposure area A, the shutter Sh2 moves to shut off the exposure beam B so as to prevent the outside of the side A3 of the exposure area A from being irradiated with the exposure beam B.

Since the exposure beam B is uneven in light intensity, the exposure area A cannot be irradiated at an even intensity unless the exposure beam B moves across an area wider than the exposure area A by the width Wbh and the height Wbv of the exposure beam B. In order to meet the requirement, the respective shutters must completely cut off the exposure beam B, thus having the specified width and height.

Figure 4:
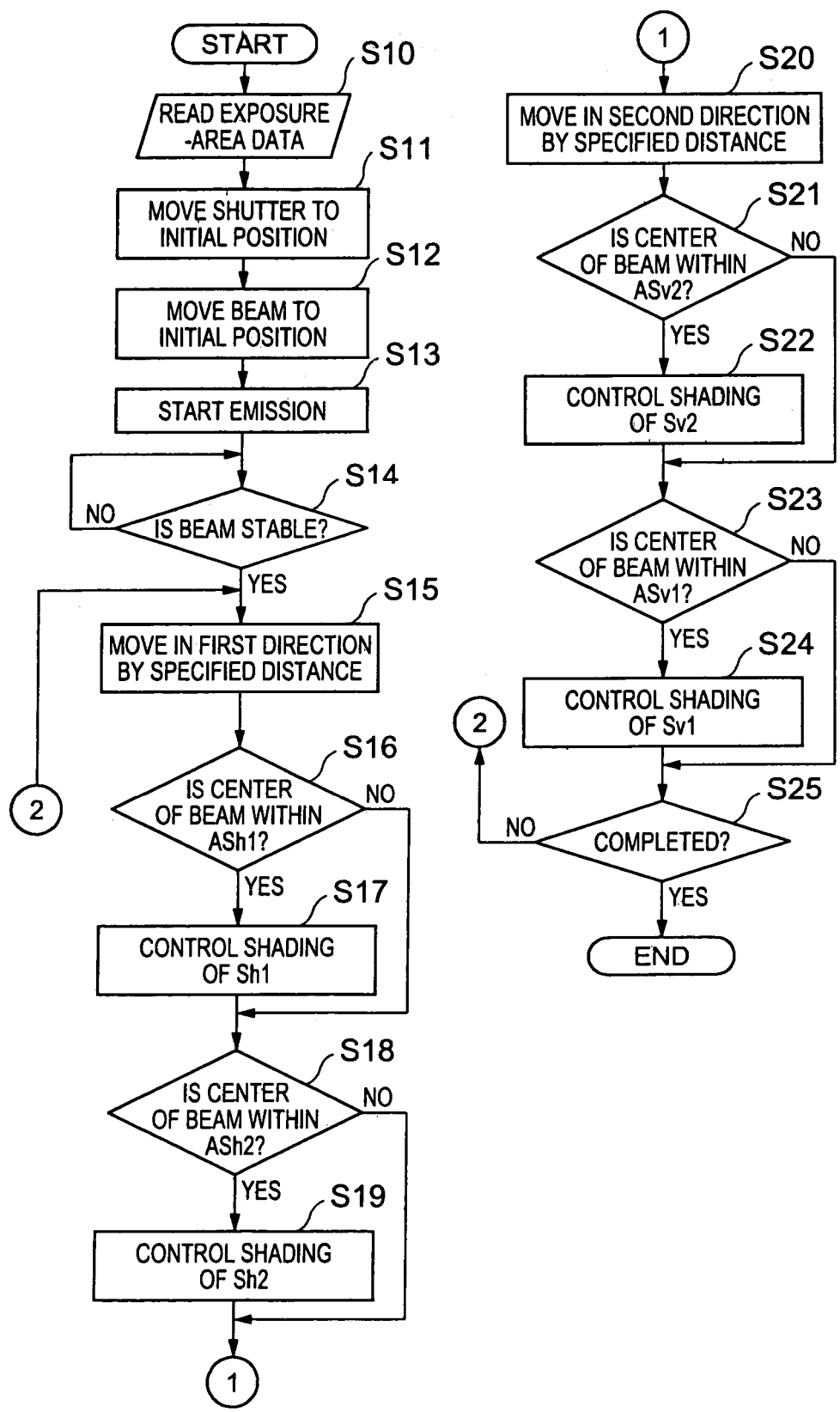
FIG. 4 is a flowchart to explain an exposing method according to the first exemplary embodiment.
Figure 5:
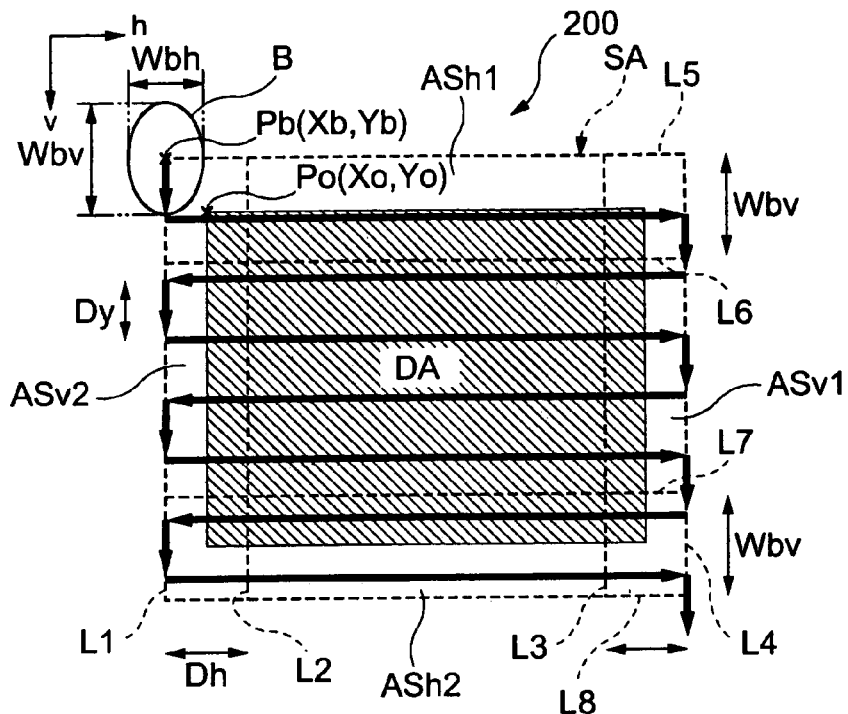
FIG. 5 is an explanatory schematic of a hologram mask surface to explain the scanning sequence according to the exposing method of the first exemplary embodiment.

Referring now to FIGS. 4 and 5, an exposing operation using the above-described aligner will be described. FIG. 4 is a flowchart to describe the control operation of the aligner. FIG. 5 is a schematic to explain a horizontal scanning sequence of the exposure projection surface with the exposure beam B when the exposure beam B is projected onto the hologram recording surface 202.

This exemplary embodiment is an example of exposing a required area by moving the light source 280 of the exposure beam B, by the exposure-light-source drive unit 282, upward and downward in parallel to the slope 203 of the prism 201 to thereby perform a main scan laterally across the hologram recording surface 202, or in the horizontal scanning direction in FIG. 1 (in h-direction in the drawing), and to perform a subscan vertically in the drawing (in v-direction in the drawing).

In this aligner, a scanning area SA specified in an aspect of the invention is set around the exposure projection area DA on the hologram recording surface 202 and the center of the exposure beam B is moved in the scanning area SA.

As the precondition of the exposing process, it is presumed that the hologram mask 200, in which interference fringes corresponding to a specified reticle pattern are recorded on the hologram recording surface 202, is adhered to the prism 201. Since the hologram mask 200 exposes only the specific exposure area A, the positional information on the exposure area A is presumed to be stored in the third information processor 100.

Referring to FIG. 4, the third information processor 100 reads out the positional information on the exposure area A, determines the positional information of the exposure projection area DA on the hologram recording surface 202, and calculates how to move the shutter S (Sh1, Sh2, Sv1, and Sv2) during the exposing process (S10). It is also possible to store the arrangement of the shutter S on the hologram recording surface 202 in advance and to read it out.

Then, control signals allowing the shutters, Sh1 and Sv2, to completely shut off the exposure beams B, are sent to the shutter drive unit 102 to shift the shutters, Sh1 and Sv2, to initial positions (S11).

Next, the second information processor 270 controls the exposure-light-source drive unit 282 to move the exposure light source 280 so that the initial position is irradiated with the exposure beam B (S12). Since the output of the exposure beam B is sometimes unstable immediately after the output, the exposure light source 280 must be stood by outside the exposure projection area DA until the output becomes stable. Therefore, in step S12, the exposure light source 280 is moved outside the origin P0 (X0, Y0) of the exposure projection area DA and to an initial position Pb (Xb, Yb) where the exposure beam B does not leak from the shutter S.

For example, assuming that the scanning sequence is determined as shown in FIG. 5, the initial position Pb (Xb, Yb) of the center point of the exposure beam B is expressed as Pb (Xb, Yb)=Pb (X0−Wbh/2, Y0−Wbv/2), where Wbh is the width of the actual exposure beam B corresponding to the horizontal direction.

The second information processor 270 supplies electricity to the exposure light source 280 to allow it to emit the exposure beam B (S13). It waits until the exposure beam B becomes stable (No in S14), and controls the exposure-light-source drive unit 282 to move the exposure beam B in a first direction, or the vertical direction v, by the distance Dy (S15).

When the center of the exposure beam B is within a shading control area Ash1 (the area surrounded by broken lines L1, L4, L5, and L6) (Yes in S16), a signal allowing the shading position of the shutter Sh1 to become the position where the exposure beam B does not irradiate the upper area other than the exposure projection area DA, is supplied to the shutter drive unit 102 to shift the shutter Sh1 (S17). Similarly, when the center of the exposure beam B is within a shading control area Ash2 (the area surrounded by broken lines L1, L4, L7, and L8) (Yes in S18), a signal allowing the shading position of the shutter Sh2 to become the position where the exposure beam B does not irradiate the lower area other than the exposure projection area DA, is supplied to the shutter drive unit 102 to shift the shutter Sh2 (S19).

Next, the exposure-light-source drive unit 282 is controlled to cause the exposure beam B to scan in a second direction, or in a horizontal direction h (S20). When the center of the exposure beam B is within a shading control area ASv2 (the area surrounded by the broken lines L1, L2, L5, and L8) during the scanning with the exposure beam B (Yes in S21), a signal allowing the shading position of the shutter Sv2 to become the position where the exposure beam B does not irradiate the left area other than the exposure projection area DA, is sent to the shutter drive unit 102 to shift the shutter Sv2 (S22).

Similarly, when the center of the exposure beam B is within a shading control area ASv1 (the area surrounded by the broken lines L3, L4, L5, and L8) during the scanning with the exposure beam B (Yes in S23), a signal allowing the shading position of the shutter Sv1 to become the position where the exposure beam B does not irradiate the right area other than the exposure projection area DA is sent to the shutter drive unit 102 to shift the shutter Sv1 (S24).

Each time the center of the exposure beam B reaches the terminal of the scanning area, it is determined whether the position is the termination of the scanning. Until it is determined that the scanning has been completed (No in S25), the subscan movement in the first direction by the distance Dy (S15), the exposure-beam-shield control with the shutters Sh1 and Sh2 (S16 to S19), the main-scan movement in the second direction (S20), and the exposure-beam-shield control with the shutters Sv1 and Sv2 (S21 to S24) are repeated. When the center of the exposure beam B reaches the terminal of the scanning area SA, the process is completed (Yes in S25).

Such exposing process in which the exposure of the area other than the exposure area is cut off with the shutter S allows all the specific exposure area A to be exposed evenly.

Figure 8A:
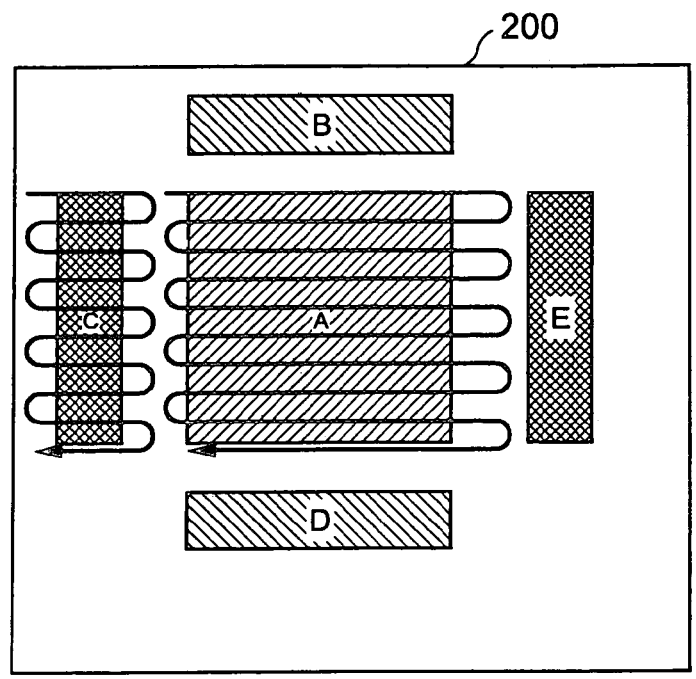
FIG. 8(A) shows an example of a combination of exposure areas that can be exposed by a related art aligner.
Figure 8B:
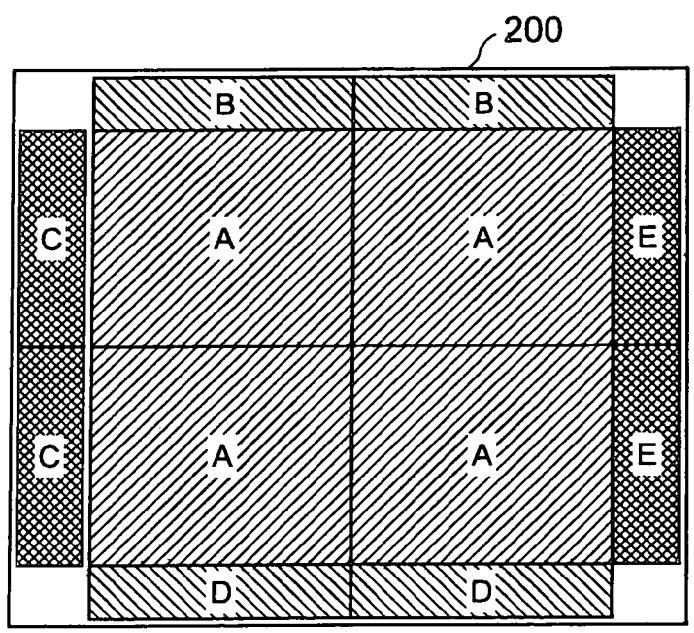
FIG. 8(B) shows an example of a combination of exposure areas of a hologram mask that can be exposed by an aspect of the invention.

FIG. 8 is an explanatory schematic to illustrate the effects of an aspect of the invention and a comparative example, in comparison with each other. In order to form a plurality of exposure areas on one hologram mask, a buffer area must be provided around each of the exposure areas, A to E, to ensure even light exposure, as shown in the comparative example of FIG. 8(A). On the other hand, according to the exemplary embodiment, since the shutter S shifts for any exposure area to determine the exposure area precisely to allow exposure, there is no need to provide the buffer area between the exposure areas, which was necessary in the related art. Therefore, since different exposure areas can be disposed adjacent to one another, as shown in FIG. 8(B), a hologram mask with high density can be exposed.

As described above, according to the first exemplary embodiment, since an aligner that satisfies the minimum shape condition required of the shutter S can be provided, it can also be applied to a compact aligner.

According to the first exemplary embodiment, since the shutters can prevent the irradiation of an area other than any exposure area with the exposure beam, a plurality of exposure areas can be disposed adjacent to one another without providing a buffer area and with high density.

Second Exemplary Embodiment

A holographic aligner according to a second exemplary embodiment of the invention performs a main scan of a hologram mask with an exposure beam vertically (in v-direction of FIGS. 1 and 6) and a subscan horizontally (in h-direction in FIGS. 1 and 6) to perform exposure. Although the exposing method of the exemplary embodiment is substantially the same as that of the flowchart in the first exemplary embodiment shown in FIG. 4, the scanning sequence (the main scanning direction and the subscanning direction) with the exposure beam is different. Since the entire structure of the holographic aligner of the second exemplary embodiment is the same as that of the first exemplary embodiment, its description will be omitted.

Figure 6:
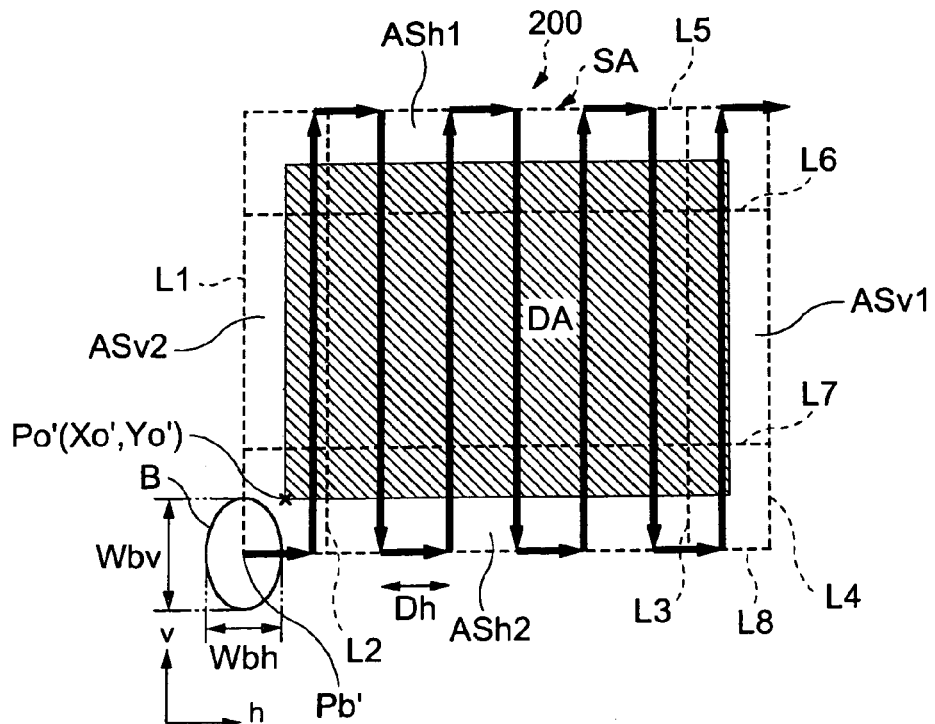
FIG. 6 is an explanatory schematic of a hologram mask surface to explain the scanning sequence according to the exposing method of a second exemplary embodiment.
Figure 7:
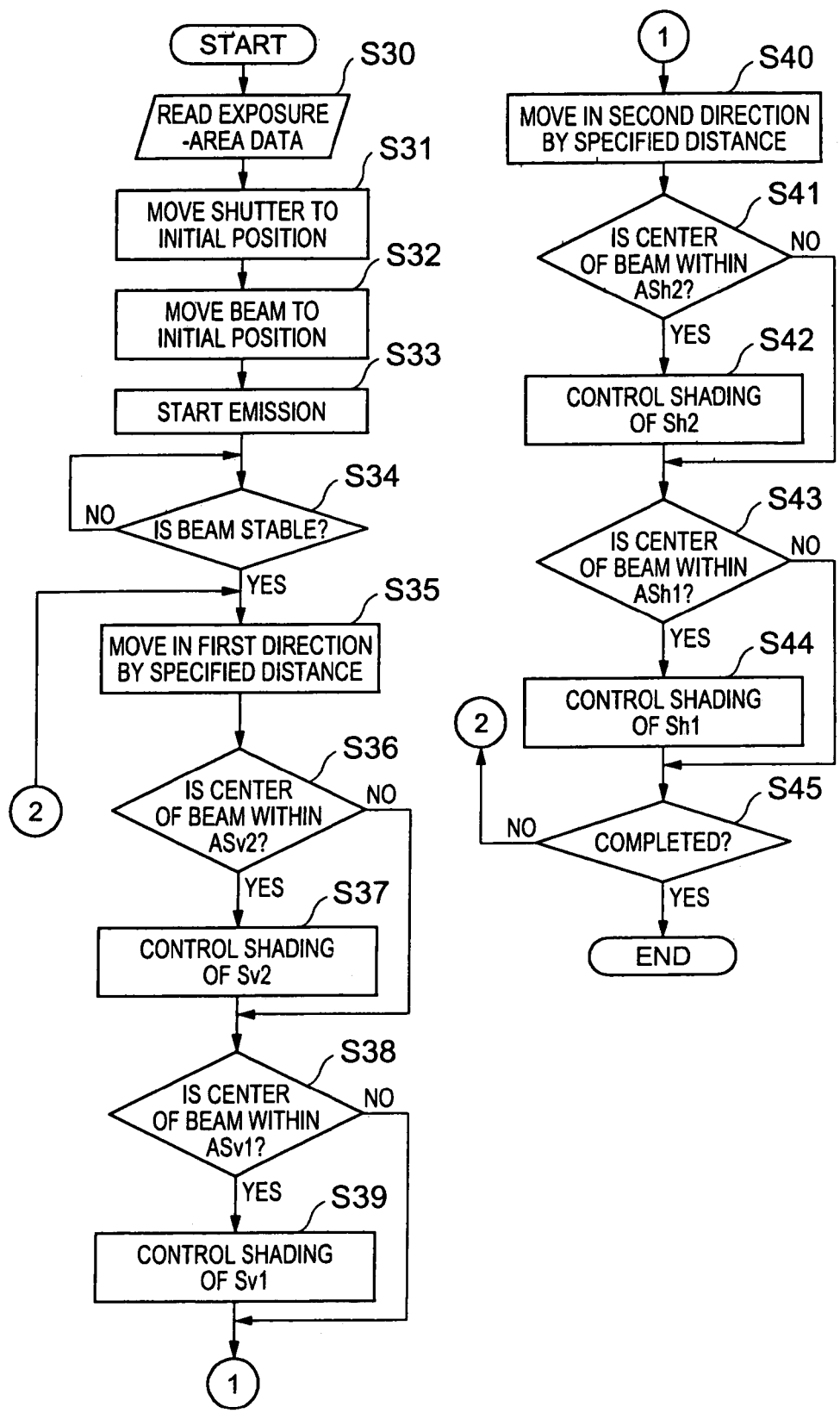
FIG. 7 is a flowchart to explain the exposing method according to the second exemplary embodiment.

FIG. 6 is an explanatory schematic to explain the scanning sequence of the exposure projection area DA with the exposure beam B in the second exemplary embodiment. FIG. 7 is a flowchart for explaining the control operation of the aligner of the exemplary embodiment.

Also in the second exemplary embodiment, the scanning area SA specified by an aspect of the invention is set around the exposure projection area DA and the center of the exposure beam B shifts within the scanning area SA.

As a precondition of the exposing process, as in the first exemplary embodiment, it is presumed that the hologram mask 200, in which interference fringes corresponding to a specified reticle pattern are recorded on the hologram recording surface 202, is adhered to the prism 201. Since the hologram mask 200 exposes only the specific exposure area A, the positional information about the exposure area A is stored in the third information processor 100.

The third information processor 100 reads out the positional information on the exposure area A, determines the positional information of the exposure projection area DA on the hologram recording surface 202, and calculates how to move the shutter S on the hologram recording surface 202 (S30). It is also possible to store the moving sequence of the shutter S on the hologram recording surface 202 in advance and to read it out.

Then, control signals, allowing the shutters, Sh1 and Sv2, to completely shut off the exposure beams B, are sent to the shutter drive unit 102 to shift the shutters Sh1 and Sv2 (S31).

Next, the second information processor 270 controls the exposure-light-source drive unit 282 to move the exposure light source 280 so that an initial position Pb' is irradiated with the exposure beam (S32). In this exemplary embodiment, the initial position Pb' is set left outside of the area DA (refer to FIG. 6). In this case, the initial position Pb' (Xb', Yb') of the center of the exposure beam B is expressed as Pb' (Xb', Yb')=Pb'(X0'−Wbv/2, Y0'−Wbh/2).

The second information processor 270 supplies electricity to the exposure light source 280 to allow it to emit the exposure beam B (S33). It waits until the exposure beam B becomes stable (No in S34), and controls the exposure-light-source drive unit 282 to scan with the exposure beam B in the first direction, or in the horizontal direction h, now by the distance Dh (S35).

Then, when the center of the exposure beam B is within a shading control area Asv2 (the area surrounded by broken lines L1, L2, L5, and L8) (Yes in S36), a signal allowing the shading position of the shutter sh2 to become the position at which the exposure beam B does not irradiate the area other than the exposure projection area DA, is supplied to the shutter drive unit 102 to move the shutter Sv2 (S37).

Similarly, when the center of the exposure beam B is within the shading control area ASv1 (the area surrounded by the broken lines L3, L4, L5, and L8) (Yes in S38), a signal allowing the shading position of the shutter Sh1 to become the position where the exposure beam B does not irradiate the area other than the exposure projection area DA, is sent to the shutter drive unit 102 to shift the shutter Sv1 (S39).

Next, the exposure-light-source drive unit 282 is controlled to scan with the exposure beam B in the second direction, or in the vertical direction v (S40). When the center of the exposure beam B is within the shading control area ASh2 (the area surrounded by the broken lines L1, L4, L7, and L8) during the scanning with the exposure beam B (Yes in S41), a signal allowing the shading position of the shutter Sh2 to become the position where the exposure beam B does not irradiate the area other than the exposure projection area DA, is sent to the shutter drive unit 102 to shift the shutter Sh2 (S42).

Similarly, when the center of the exposure beam B is in the shading control area ASh1 (the area surrounded by the broken lines L1, L4, L5, and L6) during the scanning with the exposure beam B (Yes in S43), a signal allowing the shading position of the shutter Sh1 to become the position where the exposure beam B does not irradiate the area other than the exposure projection area DA, is sent to the shutter drive unit 102 to shift the shutter Sh1 (S44).

Each time the center of the exposure beam B reaches the terminal of the scanning area, it is determined whether the position is the termination of the scanning. Until it is determined that the scanning has been completed (No in S45), the movement in the first direction (S35), the exposure-beam-shield control with the shutters Sv2 and Sv1 (S36 to S39), the movement in the second direction (S40), and the exposure-beam-shield control with the shutters Sh2 and Sh1 (S41 to S44), are repeated.

Such a process allows all the specific exposure area A to be exposed evenly, although in different scanning sequence, as in the first exemplary embodiment.

As described above, according to the second exemplary embodiment, since an aligner that satisfies the minimum shape condition required of the shutter S can be provided, the aligner can be remarkably reduced in size.

According to the exemplary embodiment, since the shutter can prevent the irradiation of an area other than any exposure area with the exposure beam, a plurality of exposure areas can be made adjacent to one another without providing a buffer area and with high density.

Other Modifications

It is to be understood that the present invention is not limited to the above-described exemplary embodiments and that changes and variations may be made.

For example, while the exemplary embodiments have been described of the application of the present invention to a holographic aligner, it is to be understood that the invention is not limited to that and may be applied to other exposing methods.

In addition, in the exemplary embodiments, the exposure area is rectangular and the number of shutters is four; however, the number of the sides thereof may be three or five or more. Such applications allow polygonal exposure areas including a triangle and a pentagon to be exposed to light. Alternatively, it is possible to use a douser that is open in the center.

Furthermore, there is no need to expose the exposure area by sequential scanning and it is possible to expose it along a spiral or radial scanning path. In any applications, the center of the exposure beam does not preferably does not go out of the scanning area of the invention, except in cases where the width of the shutter is larger than a critical value.

As set forth above, since the invention provides a douser of a minimum size that satisfies the condition required for partial exposure, the aligner exposing any exposed area can be remarkably reduced in size as compared with the related art.

Furthermore, according to an aspect of the invention, since the douser is constructed to be movable to expose any exposure area, the outer edge of the exposure area can be determined clearly, so that a plurality of exposure areas can be disposed adjacent to one another with high density without providing a buffer area.

Method to Manufacture Thin-Film Transistor Using Exposing Method and Aligner of the Invention A case of forming a gate electrode of a thin-film transistor using the exposing method and the aligner of the invention will be described as an application example.

In forming a thin-film transistor, a semiconductor layer including a source area, a drain area, and a channel area serving as an active layer is formed on a substrate through an insulator film, such as a silicon dioxide film.

In this case, examples of the semiconductor layer include a polycrystalline silicon thin film formed by crystallizing amorphous silicon under low or high temperature and a monocrystal silicon thin film formed by growing crystal grains, which are each formed using a known technique.

Then, a gate insulator is formed on the semiconductor layer, and a gate metallic thin film made of a specified metal, such as tantalum or aluminum, is formed thereon. On the metallic thin film is formed a photoresist film, and a gate electrode pattern is formed on the photoresist layer.

When the gate electrode pattern is formed, a mask pattern made by the exposing method and the aligner of an aspect of the invention is used. Specifically, carried out are a scan control step of moving the center of an exposure beam having a specified beam width, across the exposure area on the photosensitive resin, within a scanning area not exceeding the width corresponding to a half of the width of the exposure beam from the exposure area; a shading control step of moving a douser having a width and a height corresponding to at least the beam width, to shut off part or all of the exposure beam to prevent the exposure beam from reaching the area other than the exposure area; a mask-pattern forming step of forming a mask pattern by etching the photosensitive resin on which a specified pattern is formed through the scan control step and the shading control step; and an electrode forming step of forming a gate electrode using the mask pattern.

In this way, for example, a gate electrode pattern of 0.5 μm line width can be formed in a photoresist layer on a substrate of 300×300 mm². Then, the metallic thin film under the photoresist layer is subjected to patterning by anisotropic etching to form a gate electrode.

Next, impurity ions, serving as donors or acceptors, are implanted using the gate electrode as a mask to form a source/drain area and a channel area on the gate electrode by self-aligning. For example, to form an N-channel MOS transistor, phosphorus (P) is implanted to the source/drain area at a specified concentration, e.g. $1\times10^{16}$ $cm^{-2}$ as an impurity element. Thereafter, the impurity element is activated by applying appropriate energy, e.g. xenon chloride (XeCl) excimer laser, at an irradiation energy density of the order of 200 to 400 mJ/cm² or, alternatively, by heat treatment at the order of 250 to 450° C.

Thereafter, an interlayer insulator film, a contact hole, a source/drain wire and so on are formed using a related art thin-film-transistor manufacturing method.

Unlike the related art thin-film transistors, the thin-film transistor manufactured in such a way has a fine gate electrode, providing performance capability equivalent to that of a silicon-on-insulator (SOI) transistor, including a high-output current, a low-subthreshold slope, a low-threshold voltage, and high-speed operation.

Furthermore, the thin-film transistor manufactured using the aligner and the exposing method of an aspect of the invention can be applied to display devices and electronic devices. Here the "display devices" indicate general devices including electro-optical devices that emit light by electric action or change the state of light from outside and include one that emits light by itself and one that controls the passage of external light. The electro-optical devices include, for example, liquid crystal devices, electrophoretic devices, electroluminescence (EL) devices, and electron emission devices that emit light by applying electrons generated by application of an electric field onto a luminous plate.

Figure 9:
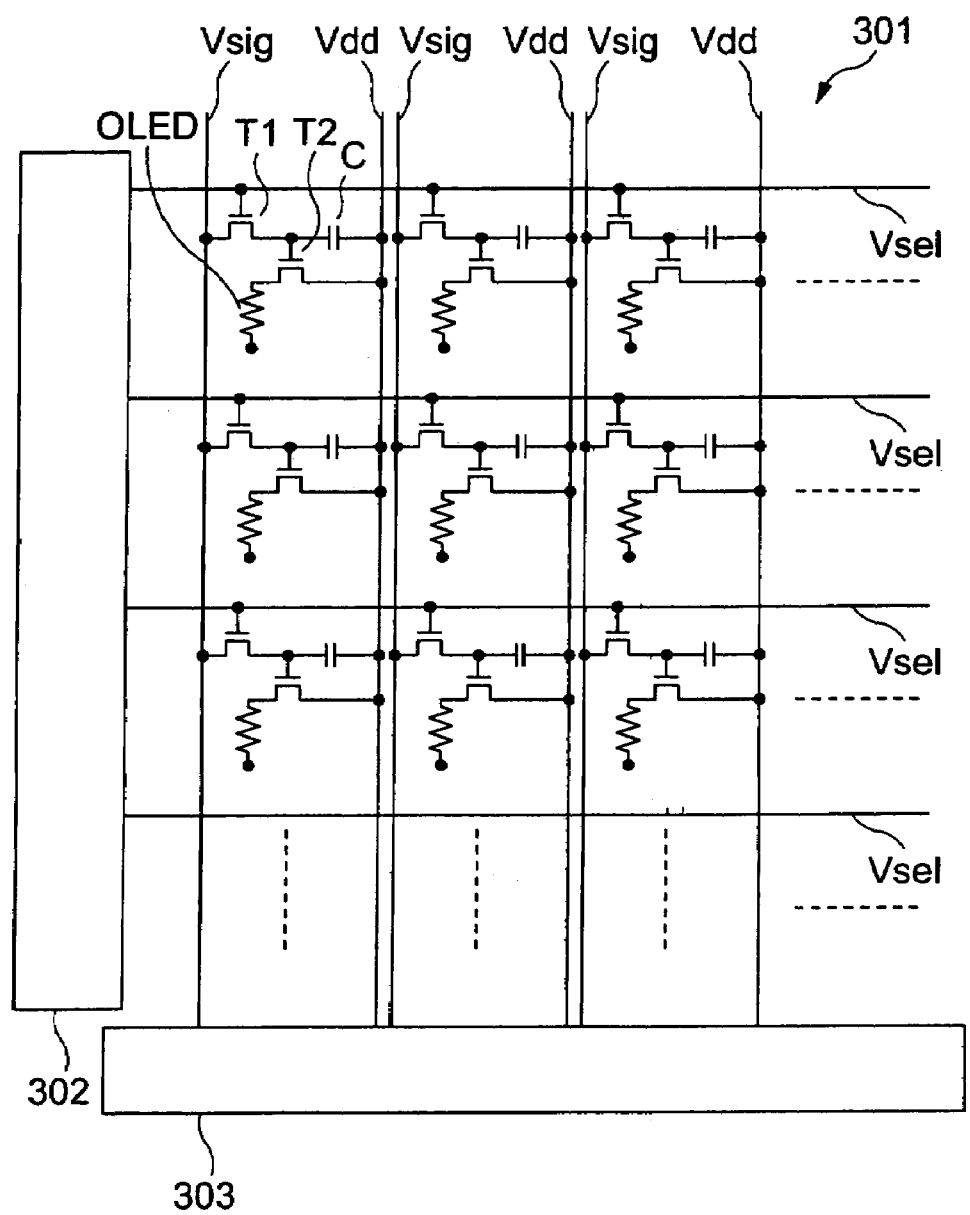
FIG. 9 is a connection schematic of a display device.

FIG. 9 shows a connection schematic of a display device according to the exemplary embodiments. In the display device, each pixel area 301 includes a luminous layer OLED capable of emitting light by an electroluminescence effect, a hold capacitor C to store a current to drive it, and thin-film transistors, T1 and T2, manufactured by the manufacturing method of an aspect of the invention. A selection signal line Vsel is provided from a driver area 302 to each pixel area. A signal line Vsig and a power line Vdd are provided from a driver area 303 to each pixel area. A current program for each pixel area is executed by controlling the selection signal line Vsel and the signal line Vsig; thus, the light emission by the luminous section OLED is controlled.

It is noted that the above-described drive circuit is merely an example of a circuit used when electroluminescence devices are used as light emitting devices and other circuit configurations may be used. It is also possible to use liquid crystal devices as light emitting devices by varying the circuit configuration.

A display device 401 including the thin-film transistor incorporating an aspect of the invention can be also applied to various electronic devices. FIG. 10 shows various application examples of the display device to electronic devices.

Figure 10A:
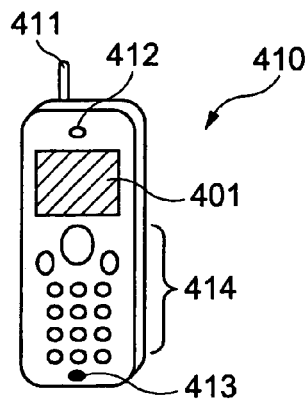
FIGS. 10A-10F show application examples of the display device to electronic devices.

FIG. 10(A) shows an application to a cellular phone. The cellular phone 410 includes an antenna section 411, a voice output section 412, a voice input section 413, an operating section 414, and the display device 401 of an aspect of the invention. Thus the display device of an aspect of the invention can be used as a display section.

Figure 10B:
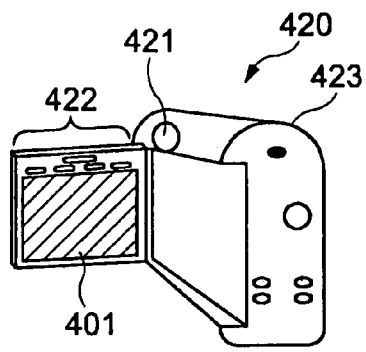

FIG. 10(B) shows an application to a video camera. The video camera 420 includes an image receiving section 421, an operating section 422, a voice input section 423, and the display device 401 of an aspect of the invention. Thus the display device of an aspect of the invention can be used as a finder and a display section.

Figure 10C:
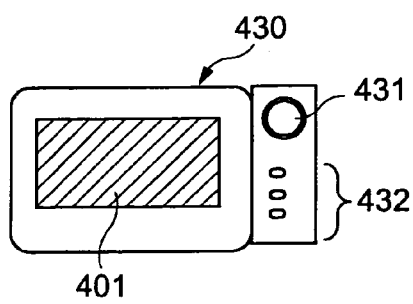

FIG. 10(C) shows an application to a portable personal computer. The computer 430 includes a camera section 431, an operating section 432, and the display device 401 of an aspect of the invention. Thus the display device of an aspect of the invention can be used as a display section.

Figure 10D:
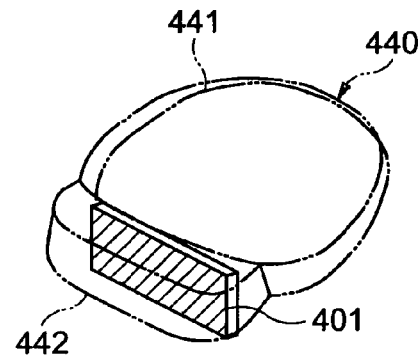

FIG. 10(D) shows an application to a head mount display. The head mount display 440 includes a band 441, an optical-system housing section 442, and the display device 401 of an aspect of the invention. Thus the display device of an aspect of the invention can be used as an image display source.

Figure 10E:
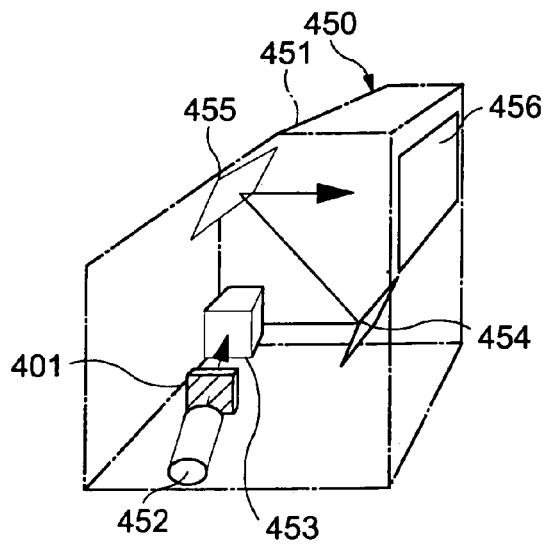

FIG. 10(E) shows an application to a rear projector. The rear projector 450 includes a light source 452, a combining optical system 453, mirrors 454 and 455, a screen 456, and the display device 401 of an aspect of the invention in a casing 451. Thus the display device of an aspect of the invention can be used as an image display source.

Figure 10F:
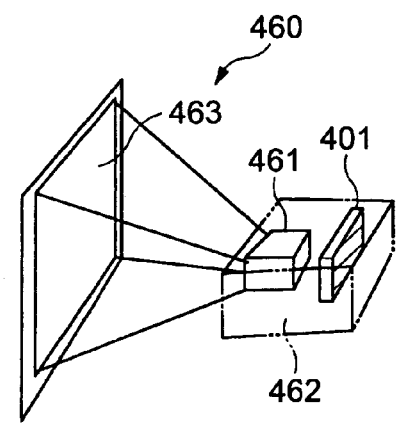

FIG. 10(F) shows an application to a front projector. The front projector 460 includes an optical system 461 and the display device 401 of the invention in a casing 462 and is capable of displaying an image on a screen 463. Thus the display device of an aspect of the invention can be used as an image display source.

In addition to the above examples, the display device 401 of an aspect of the invention can be applied to any other electronic devices to which an active matrix display device can be applied. For example, it can be also applied to a fax machine with a display feature, a finder of a digital camera, a portable TV, a digital signal processor (DSP), a personal digital assistant (PDA), an electronic databook, an electric bulletin board, an advertising display and so on, in addition to that.

What is claimed is:

1. An aligner to expose an exposure area to light, comprising:

a stage having a mount surface to hold an exposure substrate having a photosensitive film with a surface facing a hologram recording surface of a hologram mask;

a light-emitting device that emits an exposure beam having a specified width to expose the exposure area to light;

a douser having a width corresponding to at least the width of the exposure beam; and a drive unit to prevent the exposure beam from reaching an area other than the exposure area by driving the douser to shut off part or all of the exposure beam; and a range-finding optical system that adjusts a distance between the hologram recording surface and the photosensitive film surface.

2. The aligner according to claim 1, the douser having a width and a height equal to at least the width of the exposure beam.

3. The aligner according to claim 1, further comprising:
a plurality of dousers substantially perpendicular to the direction of emission of the exposure beam and driven separately along either of two intersecting directions; and
a drive unit to drive the dousers.

4. The aligner according to claim 1, further comprising:
four dousers substantially perpendicular to the direction of emission of the exposure beam and driven separately along either of two intersecting directions; and
a drive unit to drive the dousers.

5. The aligner according to claim 1, further comprising:
a douser capable of moving substantially perpendicular to the direction of emission of the exposure beam; and
a drive unit to drive the douser.

6. The aligner according to claim 1, the light-emitting device shifting the center of the exposure beam within an area of not exceeding a width corresponding to one-half of the width of the exposure beam from the exposure area.

7. The aligner according to claim 1, the drive unit moving the douser so that the exposure beam reaches only the exposure area when the distance between the center of the exposure beam and the boundary of the exposure area is equal to or less than one-half of the width of the exposure beam.

8. An aligner to expose an exposure area to light, comprising:
a stage having a mount surface to hold an exposure substrate having a photosensitive film with a thickness;
a light-emitting device that emits an exposure beam having a specified width to expose the exposure area to light;
a douser having a width corresponding to at least the width of the exposure beam;
a drive unit to prevent the exposure beam from reaching an area other than the exposure area by driving the douser to shut off part or all of the exposure beam; and
a film-thickness measuring optical system that measures the thickness of the photosensitive film.

9. The aligner according to claim 8, the douser having a width and a height equal to at least the width of the exposure beam.

10. The aligner according to claim 8, further comprising:
a plurality of dousers substantially perpendicular to the direction of emission of the exposure beam and driven separately along either of two intersecting directions; and
a drive unit to drive the dousers.

11. The aligner according to claim 8, further comprising:
four dousers substantially perpendicular to the direction of emission of the exposure beam and driven separately along either of two intersecting directions; and
a drive unit to drive the dousers.

12. The aligner according to claim 8, further comprising:
a douser capable of moving substantially perpendicular to the direction of emission of the exposure beam; and
a drive unit to drive the douser.

13. The aligner according to claim 8, the light-emitting device shifting the center of the exposure beam within an area of not exceeding a width corresponding to one-half of the width of the exposure beam from the exposure area.

14. The aligner according to claim 8, the drive unit moving the douser so that the exposure beam reaches only the exposure area when the distance between the center of the exposure beam and the boundary of the exposure area is equal to or less than one-half of the width of the exposure beam.

* * * * *